US006944560B2

(12) United States Patent
Kuo

(10) Patent No.: US 6,944,560 B2
(45) Date of Patent: Sep. 13, 2005

(54) METHOD FOR ELIMINATING NOISE SIGNALS IN RADIO SIGNAL RECEIVING DEVICES

(75) Inventor: Chin-Cheng Kuo, Keelung (TW)

(73) Assignee: Lite-On Technology Corporation, Taipei (TW)

( * ) Notice: Subject to any disclaimer, the term of this patent is extended or adjusted under 35 U.S.C. 154(b) by 45 days.

(21) Appl. No.: 10/699,661

(22) Filed: Nov. 4, 2003

(65) Prior Publication Data

US 2005/0004772 A1 Jan. 6, 2005

(30) Foreign Application Priority Data

Jul. 4, 2003 (TW) ....................................... 92118337 A

(51) Int. Cl.$^{7}$ ................................................ G01R 29/26

(52) U.S. Cl. ........................................................ 702/69

(58) Field of Search .............................. 702/66, 69, 70, 702/106, 107, 124, 190, 195, 197, 191; 704/226, 228; 324/613, 614, 620

(56) References Cited

U.S. PATENT DOCUMENTS

2003/0078772 A1 * 4/2003 Wu et al. .................... 704/226
2004/0105691 A1 * 6/2004 Hama et al. .................. 399/49

* cited by examiner

*Primary Examiner*—Michael Nghiem
(74) *Attorney, Agent, or Firm*—Rabin & Berdo

(57) ABSTRACT

A method for eliminating noise signals in a radio signal receiving device receives data containing a series n bits that include a plurality of noise signal bits. The voltage level of the noise signal bits is corrected based on the voltage level of the bits before and after the noise signal bits and is transformed to the same level as the bits before and after thereby to eliminate the noise signals. The method can correct damaged data bits and determine whether the width of data bits meets requirements to avoid erroneous determination when data are damaged.

8 Claims, 4 Drawing Sheets

METHOD FOR ELIMINATING NOISE SIGNALS IN RADIO SIGNAL RECEIVING DEVICES

BACKGROUND OF THE INVENTION

1. Field of Invention

The invention relates to a method for eliminating noise signals and particularly to a method adopted for use in radio signal receiving devices of computer peripherals that are connected to the computer through a universal series bus.

2. Related Art

The Universal Series Bus (USB) is a standard established by USBIF (USB Implement Forum) which is composed of Compaq, Digital, IBM, Intel, Microsoft, NEC, and Nortel in 1995. The current specification is USB v2.0 edition for high-speed transmission bandwidth.

Establishing a USB mainly aims to resolve the chaotic connection interfaces of computer systems and integrates the hardware external interfaces to achieve simple use. Almost all computer peripherals nowadays such as a mouse, keyboard, printer or scanner have adopted a USB as the interface to communicate with the computer.

In order to resolve the messy cabling problem of peripherals such as a mouse or a keyboard, the concept of a TV remote controller in the prior art has been adopted in the functions of a mouse and a keyboard. Take the keyboard for instance; the keyboard may include a radio frequency emission device to correspond to a radio frequency receiving device which is connected to a computer system through a USB interface. When users press a key, the radio frequency emission device transmits a signal package to be received by the receiving device to enable the computer to process a corresponding operation.

However, the data package transmitted by a radio frequency signal tends to be affected or interfered by external environments and the integrity of a data package might suffer. Referring to FIG. 1, the upper portion indicates the complete data bit sets that have been transmitted. The lower portion is the signal after interference has occurred. At present, the function of eliminating or correcting the noise signal bits mostly is accomplished by firmware through a USB chip. Because the cycle of taking samples is too long when a noise signal occurs, it is often not possible to filter the noise signal by the sampling approach. Hence few can pass the certification.

Moreover, take an example, with data bits being 1 and the time length of the data bits being a constant T, the sampling period being T/8, every data bit could include eight sampling bits. If one of the sampling bits is damaged or interfered, the data bit is viewed as ineffective. And the entire data package is treated as an error. As a result, users have to operate again and send a series of data anew. This causes huge inconvenience.

SUMMARY OF THE INVENTION

In view of the aforesaid disadvantages, the primary object of the invention is to provide a method for eliminating noise signals in radio receiving devices, to determine whether the signal is damaged when a radio frequency signal carried serial data is received and to correct the damaged signal.

In order to achieve the foregoing object, the method of the invention includes a plurality of noise bits in data that contain a series n sample bits. Further, filters the noise signal bits and transforms them to have the same level as the front bit and the rear bit, based on the level of the front bit and rear bit of the noise bits. Next, records the sampling bit number that has the same level and converts to the width of the data bits received. As the width of bits in digital transmission tends to fluctuate because of environmental interference, the recording value may be used to determine whether the received bit width is within the allowable error range, and erroneous bits that are too short or too long may be filtered out.

Thus the method of the invention can correct the damaged data bits and determine whether the width of data bits meets requirements to avoid data damage and mistaken determination when the computer peripherals transmit series data.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow illustration only, and thus are not limitative of the present invention, and wherein.

DETAILED DESCRIPTION OF THE INVENTION

Figure 1:
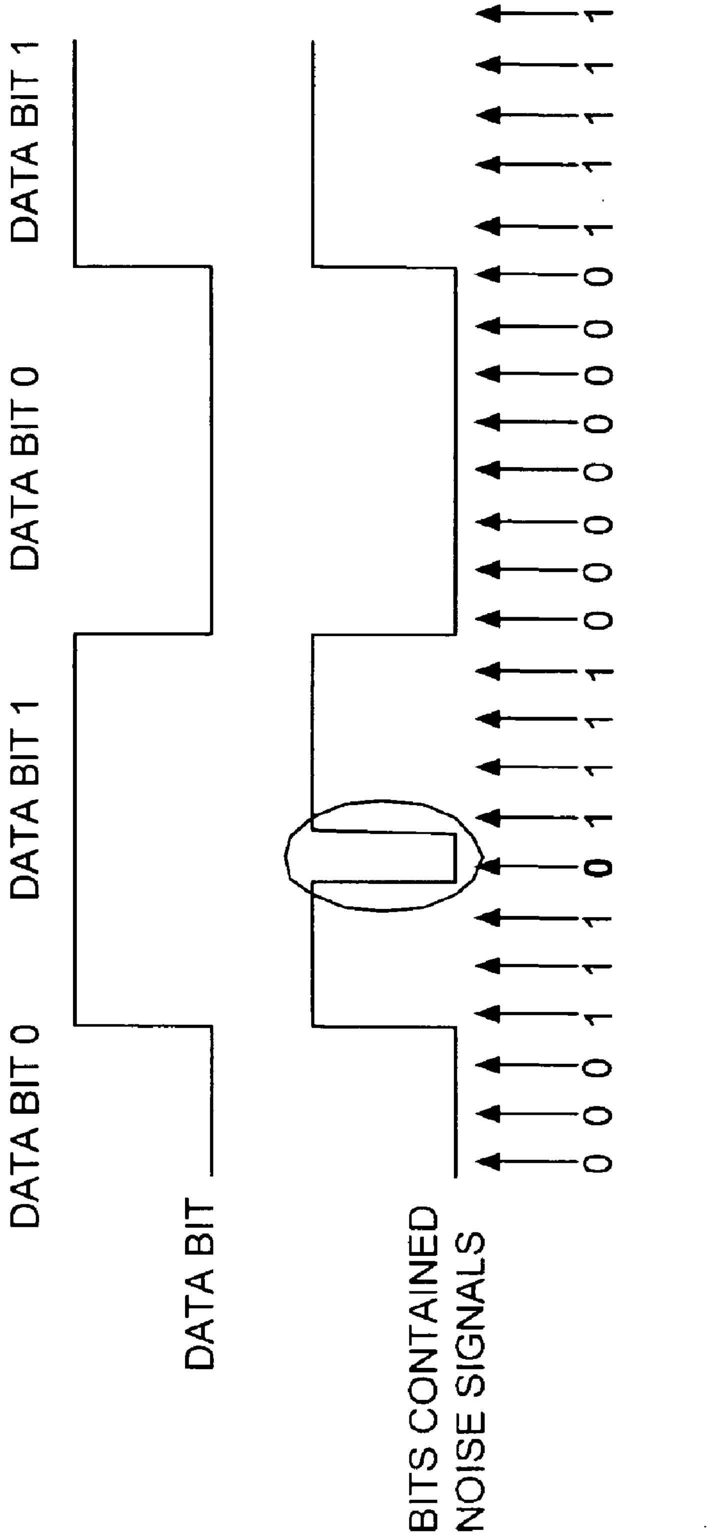
FIG. 1 is a chart showing the time sequence of series data containing noise bits.
Figure 2:
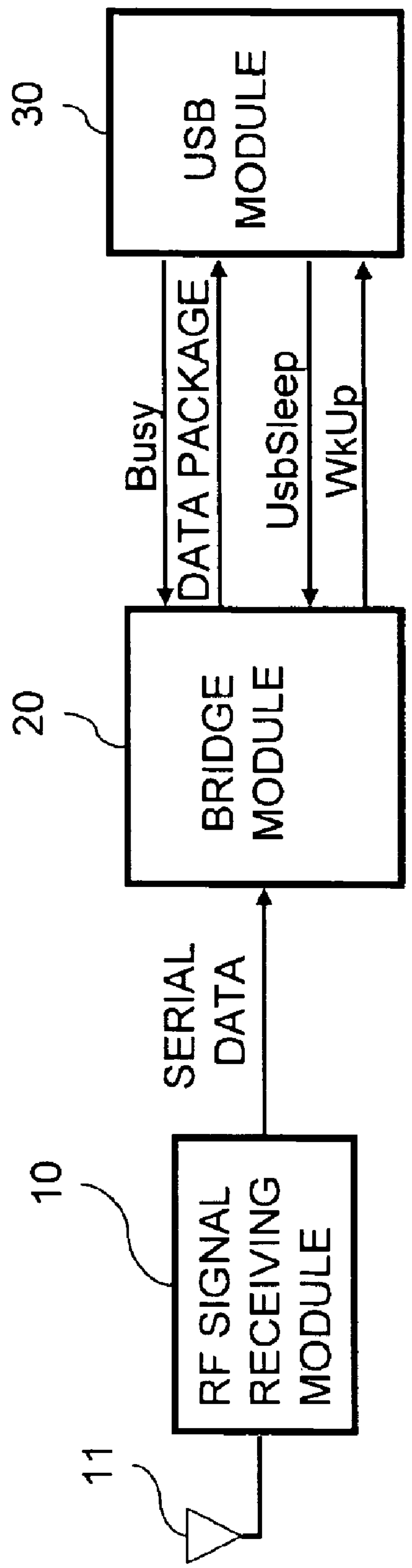
FIG. 2 is a block diagram showing the system architecture of a radio signal-receiving device according to the invention.

A radio-receiving device used in computer peripherals, connecting to a computer through USB, is used as an embodiment of the invention. Refer to FIG. 2 for the system structure of the device. It includes three main modules: a radio frequency signal receiving module 10, a bridge module 20 and a USB module 30. The bridge-processing module 20 is coupled to the RF signal receiving module 10. The USB module 30 is coupled to the bridge module 20, and is connected to a computer USB connection port through a USB data transmission line to form a transmission circuit with the computer system, to transmit the received data package to the computer. In addition, the USB module 30 may be connected to LED indication lights (not shown in the drawings), to display related messages. Or EEPROM (not shown in the drawings) may also be connected to store related operating software.

The RF signal receiving module 10 has an antenna 11 to receive radio frequency signals. The radio frequency signal receiving module 10 mainly receives series data transmitted from computer peripheral devices (such as mouse, keyboards). The series data are transmitted through radio frequency signals.

The bridge module 20 mainly performs three operations. First, it controls the switch condition of the radio frequency signal receiving module 10 to conform to the operation current of USB power saving mode. Second, it reads the radio frequency signals received by the radio frequency signal receiving module 10 that carry series data and correct the noise signals in the received radio frequency signals. Finally, it transmits the correct series data in a package format to the USB module 30, and sends a wakeup signal, WkUp, to the USB module 30.

The bridge module 20 is preferably an integrated circuit (IC) which has at least one watch dog timer. Its operation current is approximate to the operation current of the USB device operating in the power saving mode, slightly less than 1 mA, but far smaller than the operation current of the USB module 30. When in an idle mode that conforms to USB specifications, the operation may continue.

The USB module 30 is preferably an IC or a USB interface controller to receive data packages from the bridge module 20, and transfer to the computer system. When the USB interface is busy, a busy signal is transmitted to the bridge-processing module 20 so that the bridge module 20 may temporarily store the data packages to be transmitted. When in the idle mode, a first sleep signal, UsbSleep, is sent to the bridge module 20 so that a second sleep counter in the bridge module 20 may start counting.

Referring to FIG. 2, in order to enable the radio signal receiving device to meet the requirement of USB low current consumption, the device is designed with four operation modes: a normal mode; first idle mode, second idle mode and search mode. In the normal mode all modules are open and transmit and receive data normally. The first idle mode means that the USB module 30 enters the idle mode, and the second idle mode means that the bridge module enters the idle mode. The search mode means that in the second idle mode after a monitor period has elapsed, the bridge module activates the radio frequency signal receiving module to search whether a radio frequency signal exists.

In short distance signal transmission, regulation for signal interference is quite strict. For transmission and receiving devices, signal accuracy permits damages to only a few bits. If there are too many damaged bits in the receiving data, the most likely cause is a device problem. Conventional receiving devices usually have only one USB chip module to process all series data. They do not have adequate processing power to do noise processing. To eliminate all noise signals, the only way is using advanced chip modules. This will result in a higher cost. The invention uses a bridge-processing module that does not increase cost very much and can greatly improve the shortcomings happened to conventional radio signal receiving devices.

Figure 3:
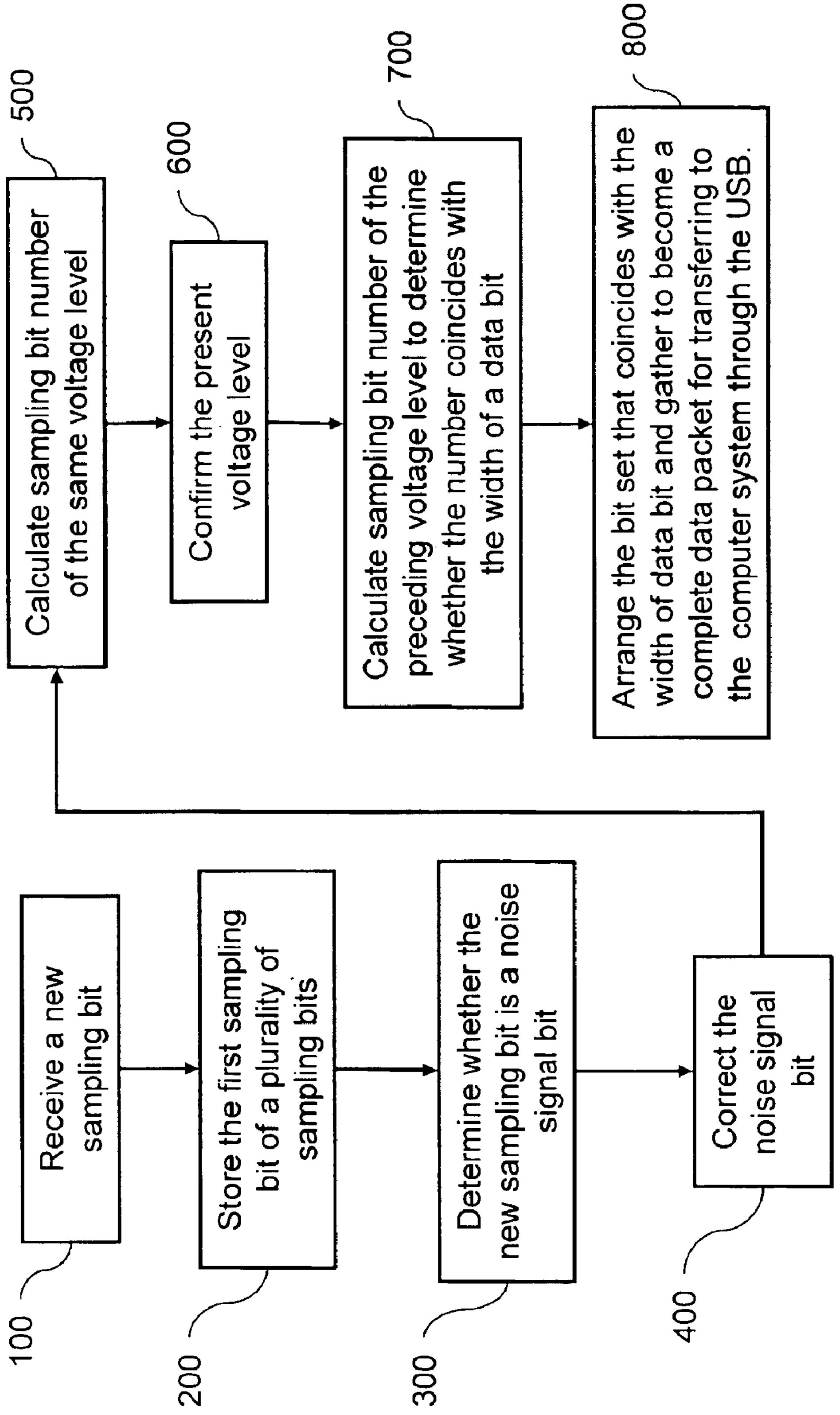
FIG. 3 is the flow chart of the method for eliminating noise signals according to the invention.

Refer to FIG. 3 for the process flow of the noise elimination method of the invention. The method may be applied for the bridge-processing module of a radio signal-receiving device shown in FIG. 2. The difference from conventional techniques is that the invention is accomplished through a bridge module and can effectively increase sampling frequency and reduce the problem of low sampling frequency occurred to the conventional techniques that use USB chips.

First, receive a new sampling bit (step 100); store a first sampling bit from a plurality of sampling bits (step 200); compare the voltage level of every sampling bit in the sampling data bits, and determine whether the new sampling bit is a noise bit (step 300). If the plurality of sampling bits numbers three, then step 300 is to determine whether the previous third sampling bit is a noise sampling bit. Also if the plurality of sampling bits numbers three, at the time of the determination the previous third sampling bit will have been stored as a new second sampling bit; the new sampling bit will have been stored as a new third sampling bit; and the previous second sampling bit will have been stored as a new first sampling bit. Pluralities other than three, i.e. pluralities numbering n, where n is an integer, are within the scope of the invention.

If a noise bit exists after the determination at step 300, correct the voltage level of the noise bit (step 400). This is accomplished based on the voltage level of the first sampling bit and the last sampling bit of the sampling bits.

Then calculate the number of stored first sampling bits that have the same voltage level (step 500), and take the voltage level of the first sampling bits that has the same voltage level as the present voltage level (step 600).

Confirm the voltage level of the present sampling bits; calculate the sampling bit number of the preceding voltage level to determine whether the number coincides with the width of data bits (step 700). Arrange the sampling bit sets that coincide with the data bit width and gather to become a complete data package transfer to the computer system through the USB (step 800).

In the following, three sampling bits are used as an example to explain the process set forth above. First, three sampling bits are provided in a state machine, in the order of a first sampling bit, a second sampling bit and a third sampling bit. The third sampling bit is the latest sampling bit being received. After having received a new sampling bit, the previous first bit is stored, and the second sampling bit becomes the first bit, and the third bit becomes the second bit, and the latest receiving bit becomes the third bit. After storing is completed, determine whether the previously received sampling bit, i.e. the second sampling bit in the present state machine, is a noise bit.

The determination method is to compare the voltage level of the three sampling bits. With the same voltage level for the first sampling bit and the third sampling bit, compare the voltage level of the second sampling bit. If the voltage level of the second sampling bit is different from the voltage level of the first and the third sampling bits, according to the correction rule disclosed in the invention, the second sampling bit, i.e. the preceding sampling bit being received, is a noise bit. Then the bridge-processing module 20 in the radio signal-receiving device corrects the noise bit. Namely, the voltage level of the second sampling bit is corrected to become the same voltage level of the first and the third sampling bits. If the present second sampling bit is not a noise bit, continue to receive new sampling bits.

When the state machine receives three sampling bits of the same voltage level, it may be determined as the present voltage level. And determine the sampling bit number of the preceding same voltage level to confirm whether the width of the sampling bits coinciding with the width of the data bit. If the width is too large or too small, it indicates that the receiving data have been severely interfered or damaged, and the data should be abandoned.

Figure 4:
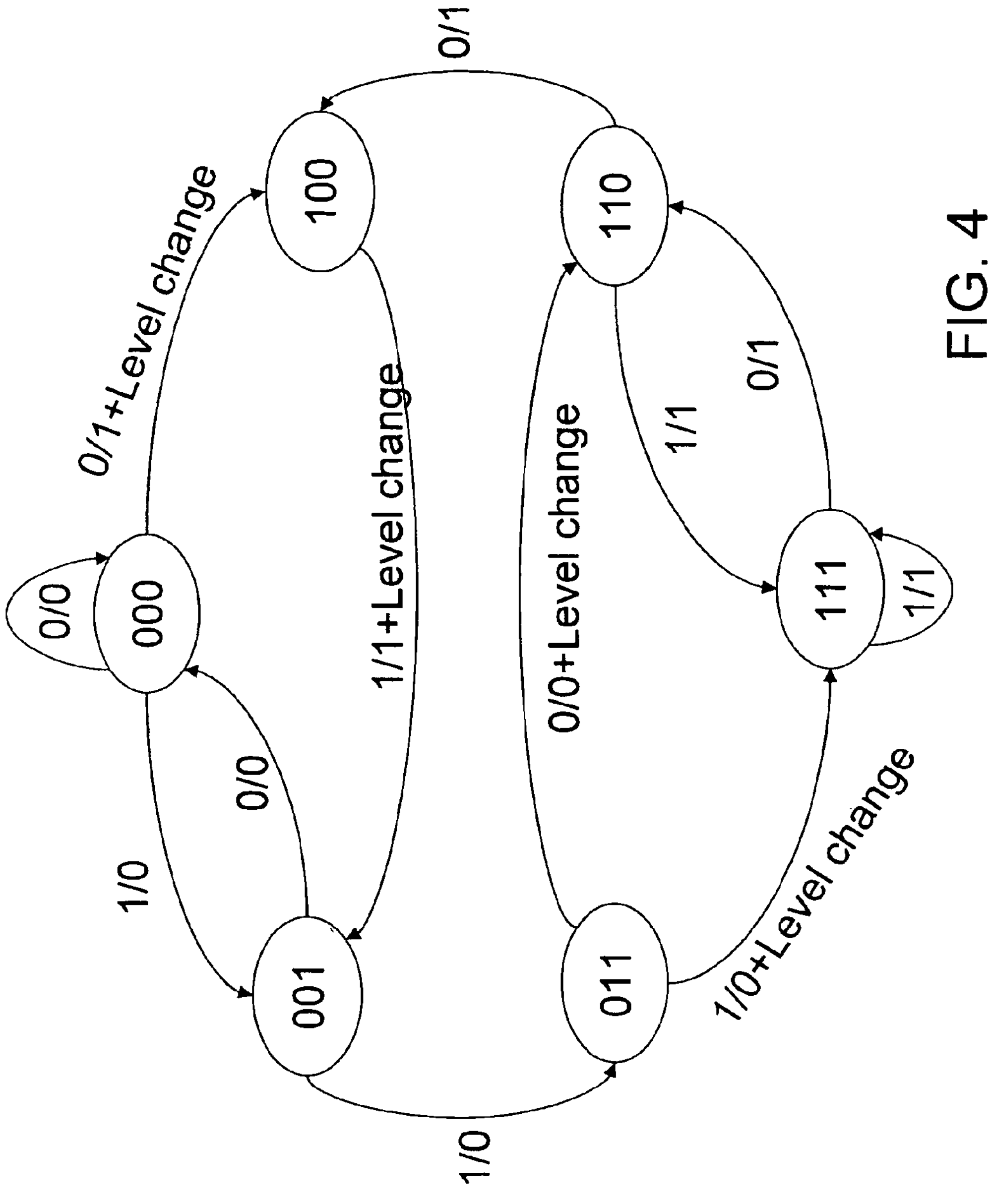
FIG. 4 is a chart showing state transfer according to the method for eliminating noise signals of the invention.

Refer to FIG. 4 for the state transfer of the noise eliminating method according to the invention. The confirmation method for the voltage level of the presently receiving sampling bit also is discussed accompanying the drawing.

The invention uses the level of consecutive bits to determine whether the presently receiving bits are noise. Take three bits as an example. There are six states shown in the drawing: 『000』, 『001』, 『011』, 『111』, 『110』 and 『100』. As the voltage level of the consecutive bits is used for determination, if the present state is 『001』, after having received sample bit 『0』, the state machine changes to 『010』. According to the correcting rule of the invention, it will be corrected to 『000』. Similarly, if the present state is 『110』, after having received sampling bit 『1』, the state machine changes to 『101』. According to the correcting rule of the invention, it will be corrected to 111. Hence there are no states of 『010』 and 『101』 in the drawing. The state transfer shown in the drawing is elaborated as follows:

If the present state is 『000』, and if the next sampling bit is 0, the first sampling bit in 『000』 will be stored, and the state is still 『000』. If 0 is received continuously, the state will remain 『000』 continuously. 0/0 shown in the drawing represents state transfer condition. The preceding 0 represents the next sampling bit 0 received, the rear 0 represents the first sampling bit in 『000』 and is stored.

If all the presently transmitting data are 1, the state transfer becomes 『001』, 『011』 and 『111』 in this order. From 『011』 to 『111』, the voltage level of data bit changes. Namely, after having received three consecutive sampling bits that have the same voltage level, it can be confirmed as the present voltage level. At the state of 『001』, if the next bit is 0, the state changes to 『010』. According to the noise determination rule, the data bit 1 will be determined as a noise bit. Hence 『010』 will be corrected to 『000』.

At the state 『011』, if the next data bit is 0, the state changes to 『110』, and the voltage level of the sampling bit changes.

Hence, if the present state is 『000』, and if data bits of 1 are received continuously, the state will finally be changed to 『111』. Because three sampling bits of the same voltage level have been received continuously, the voltage level changes.

If the present state is 『111』, and 0 data bits are received continuously, the state changes to 『110』, 『100』, and 『000』 in this order. At the state 『110』, if the next bit is 1, then a noise bit, and it will be corrected to 『111』.

At state 『100』, if 1 is received, it will be restored to the state of 『001』, and the voltage level changes. At state 『110』, if 1 is received, the state changes to 『111』, the voltage level remains unchanged.

Hence if the present state is 『111』, and if data bits 0 are received continuously, the state will finally be changed to 『000』, and the voltage level changes.

Based on aforesaid explanation, if the present state is 『000』, and three consecutive sampling bits of the same voltage level have been received, the state changes to 『111』. If the present state is 『111』, and three consecutive sampling bits of the same voltage level have been received, the state changes to 『000』.

When two sampling bits of 1 and one sampling bit of 0 are received continuously, and the state of the state machine is 『110』, the voltage level changes. Similarly, when two sampling bits of 0 and one sampling bit of 1 are received continuously, and the state of the state machine is 『001』, the voltage level changes.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments, which do not depart from the spirit and scope of the invention.

What is claimed is:

1. A method for eliminating noise signals adopted for use in a radio signal receiving device to correct noise signals bits in sampling bits, the radio signal receiving device receiving series data from a computer peripheral device, the radio signal receiving device being connected to a computer system through a universal series bus (USB) for transmitting the series data to the computer system, the method comprising steps of:

receiving a new sampling bit of a plurality of sampling bits;

storing the new sampling bit as a new third sampling bit;

storing a previous third sampling bit as a new second sampling bit;

storing a previous second sampling bit as a new first sampling bit;

comparing voltage levels of the new first, second, and third sampling bits to determine whether the new second sampling bit is a noise signal bit; and correcting the noise signal bit based on the voltage level of the new first sampling bit and the voltage level of the new third sampling bit.

2. The method of claim 1, further comprising steps of:

determining a present voltage level based on a present sampling bits number;

calculating a number of the stored first sampling bits that have a same voltage level; and determining whether the number coincides with a width of a data bit based on the sampling bit number of a preceding voltage level, arranging sampling bit sets coinciding with the width of the data bit, and gathering a complete data package for transferring to the computer system through the USB.

3. The method of claim 2, wherein in the step of determining the present voltage level, the voltage level of the sampling bits is set as the present voltage level after receiving a plurality of sampling bits of the same voltage level.

4. The method of claim 2, wherein in the step of determining the present voltage level, when the voltage level of the last receiving sampling bit is different from that of the received sampling bits, the voltage level of the received sampling bits is set as the present voltage level.

5. A method for eliminating noise signals adopted for use in a radio signal receiving device to correct noise signals bits in sampling bits, the radio signal receiving device receiving series data from a computer peripheral device, the radio signal receiving device being connected to a computer system through a universal series bus (USB) for transmitting the series data to the computer system, the method comprising steps of:

receiving a new sampling bit of a plurality of sampling bits;

storing the new sampling bit as a new nth sampling bit, storing a previous nth sampling bit as a new (n-1)th sampling bit, and so on through the plurality of sampling bits, finally storing a previous second sampling bit as a new first sampling bit;

comparing voltage levels of the new plurality of sampling bits to determine whether the new (n-1)th sampling bit is a noise signal bit; and correcting the noise signal bit based on the voltage level of the new first sampling bit and the others of the plurality of sampling bits except for the new second sampling bit.

6. The method of claim 5, further comprising steps of:

determining a present voltage level based on a present sampling bits number;

calculating a number of the stored first sampling bits that have a same voltage level; and determining whether the number coincides with a width of a data bit based on the sampling bit number of a preceding voltage level, arranging sampling bit sets coinciding with the width of the data bit, and gathering a complete data package for transferring to the computer system through the USB.

7. The method of claim 6, wherein in the step of determining the present voltage level, the voltage level of the sampling bits is set as the present voltage level after receiving a plurality of sampling bits of the same voltage level.

8. The method of claim 6, wherein in the step of determining the present voltage level, when the voltage level of the last receiving sampling bit is different from that of the received sampling bits, the voltage level of the received sampling bits is set as the present voltage level.

* * * * *